United States Patent
Onoda et al.

[19]

[11] Patent Number: 6,031,278
[45] Date of Patent: Feb. 29, 2000

[54] IC CARD AND MANUFACTURING METHOD THEREOF

[75] Inventors: Shigeo Onoda; Katsunori Ochi; Jun Ohbuchi, all of Tokyo, Japan

[73] Assignee: Mitsubishi Denki Kabushiki Kaisha, Tokyo, Japan

[21] Appl. No.: 08/954,732

[22] Filed: Oct. 20, 1997

[30] Foreign Application Priority Data

Apr. 16, 1997 [JP] Japan ................................. P09-098743

[51] Int. Cl.$^7$ .................................................. H01L 23/02
[52] U.S. Cl. .......................... 257/679; 257/723; 438/106; 438/121
[58] Field of Search ..................... 257/679, 678, 257/723; 361/737; 174/35 R, 51; 438/106, 121, 125

[56] References Cited

U.S. PATENT DOCUMENTS 5,780,365  7/1998  Nogami ................................. 361/737
5,867,366  2/1999  Klein ..................................... 361/737

FOREIGN PATENT DOCUMENTS

| 7 45397 | 2/1991 | Japan . |
| 3-96396 | 4/1991 | Japan . |
| 3-112689 | 5/1991 | Japan . |
| 3-259364 | 11/1991 | Japan . |
| 7-160837 | 6/1995 | Japan . |

*Primary Examiner*—Carl Whitehead, Jr.
*Assistant Examiner*—Roy Potter

[57] ABSTRACT

An IC card, and manufacturing method thereof, are provided in which a pair of upper and lower metal panels are fixed to the top and bottom surfaces of a resin frame. Projections projecting upward or downward and having a given height are formed at a given distance from the outside edges of the frame. Cut-outs capable of fitting on the projections are provided on the metal panels, and the metal panels are assembled on the top and bottom surfaces of the frame with the cut-outs fitted on the corresponding projections. A portion of each projection is then deformed by pressing on the metal panels from above or below under a predetermined condition so that the metal panels are riveted to the frame.

16 Claims, 14 Drawing Sheets

IC CARD AND MANUFACTURING METHOD THEREOF

BACKGROUND OF THE INVENTION

1. Field of the Invention

The present invention relates to an IC card and a manufacturing method thereof.

2. Description of the Prior Art

IC cards generally employ a structure in which the inner components, such as electric circuit boards having specific electronic parts and the like incorporated therein, are disposed in a resin frame of which the top and bottom surfaces are covered by a pair of metal panels.

The term "IC Card," as used herein, refers to a card-like or plate-like device which comprises electronic circuits including semiconductor circuits or electric circuits, and includes PC cards, modem cards, LAN cards, memory cards and electronic cards having the same basic arrangement as the above.

In one known IC card structure (hereinafter referred to as prior art structure 1), the resin frame constituting the exterior of the card has a structure split into upper and lower parts. Such a card is assembled by uniting the upper and lower frames with the upper and lower metal panels, respectively, in advance and by joining the upper and lower frames together by techniques such as ultrasonic welding.

As shown in FIGS. 20–23, an IC card 101 according to prior art structure 1 has a resin frame which is split into the upper and lower parts, and is thus comprised of an upper frame 102U and a lower frame 102L. The upper frame 102U and an upper metal panel 107 are united to form an upper package 109U, while the lower frame 102L and a lower metal panel 108 are united to form a lower package 109L. The frames 102U, 102L and the metal panels 107, 108 are respectively united by, for example, so-called panel-frame integral molding method when the resin frames 102U, 102L are molded.

A module 103 is formed by mounting a connector 106 to one end of an electric circuit board 104 having specific electronic parts and the like 105 incorporated therein, and the IC card 101 is subsequently assembled by interposing the module 103 between the upper package 109U and the lower package 109L and then by joining both the packages 109U, 109L together.

As is evident from FIGS. 22 and 23, a protrusion (weld) 102a for welding, having a section of a specific size and of a specific shape (e.g. a triangular shape), is formed on the joint surface of one of the upper and lower frames 102U, 102L, for example, continuously along the circumference of the frame 102L.

The upper and lower packages 109U, 109L are jointed together so that the protrusion 102a for welding comes into contact with the end surface of the upper frame 102U. The contact part is pressed from above and below and subjected to ultrasonic vibrations so that the protrusion 102a melts to join the upper and lower frames 102U, 102L together at their end surfaces.

In another known IC card structure (hereinafter referred to as prior art structure 2), the upper and lower metal panels are bonded to a unitary frame with adhesive sheets.

In an IC card 111 according to prior art structure 2, as shown in FIGS. 24–27 for example, a module 113 formed by mounting a connector 116 to one end of an electric circuit board 114 having specific electronic parts and the like 115 incorporated therein is incorporated into a unitary resin frame 112, and adhesive sheets 119U, 119L having adhesive applied to both the surfaces thereof are temporarily bonded to, for example, the upper and lower sides of the frame 112.

Upper and lower metal panels 117, 118 are then attached to the upper and lower sides of the frame 112, and the metal panels 117, 118 are bonded and fixed to the upper and lower sides of the frame 112 by heating under a predetermined temperature condition and by pressing from above and below, so that the IC card 111 is assembled.

In Japanese Patent Laid-Open Publication No. HEI 3-96396 (hereinafter referred to as prior art structure 3), as shown in FIGS. 28 and 29, IC cards 121, 131 are disclosed wherein metal panels 127, 128 and 137, 138 having their circumferential portions pressed into a predetermined shape are set in depressions 122b, 132b formed on a frame 122, 132. Projections 122a, 132a formed on the outside edge portions of the frame 122, 132 are softened by local heating and then press-molded from above with a die to embed and fix the circumferential portions of the metal panels 127, 128 and 137, 138.

In prior art structure 3, the circumferential portions of the metal panels 127, 128 and 137, 138 are provided with joint openings 127h, 128h and 137h, 138h for allowing resin, respectively.

In Japanese Patent Laid-Open Publication No. HEI 3-259364 (hereinafter referred to as prior art structure 4), as shown in FIG. 30, an IC card 141 is disclosed wherein metal panels 147, 148 are set in depressions 142b formed on a frame 142. Projections 142a formed on the outside edge portions of the frame 142 are pressed with a hot press 149 to embed and fix the circumferential portions of the metal panels 147, 148. In prior art structure 4, the outside surfaces of the end portions of the projections 142a are tapered to reduce the amount of softened resin softened during the press with the hot press 149.

As disclosed in, for example, Japanese Patent Laid-Open Publications No. HEI 3-45397, No. HEI 3-112689, or No. HEI 7-160837, another known IC card structure (hereinafter referred to as prior art structure 5) includes metal panels which are fixed to a frame by providing engaging portions or press-fit portions comprising hooks, tongues, or the like on the metal panels and by engaging those portions with the frame or pressing those portions into the frame, though the cards are not such that the metal panels are fixed by deforming a part of the resin frame by pressing.

The prior art structures mentioned above, respectively, have the following drawbacks:

In prior art structure 1, it is necessary to unite the metal panels 107, 108 and the resin frames 102U, 102L, respectively, for example, by the panel-frame integral molding method when the frames are molded. Therefore, it is expensive to provide the upper package 109U and the lower package 109L.

In prior art structure 2, bonding and fixing the metal panels 117, 118 to the frame 112 requires the adhesive sheets 119U, 119L in addition to the assemblies. Therefore, the cost increases because the number of components handled during the assembling process increases, and because an additional process step is required to temporarily bond the adhesive sheets 119U, 119L to, for example, the frame 112.

In the IC cards 121, 131 according to prior art structure 3, on the outside edge portions of the frame 122, 132 are formed the projections 122a, 132a which are softened, then pressed and deformed to embed and fix the circumferential portions of the metal panels 127, 128 and 137, 138. The projections 122a, 132a are pressed and deformed directly with the dies.

As a result, in order to sufficiently fix each metal panel 127, 128 and 137, 138 in this case, taking the edge portions on the left sides in FIGS. 28 and 29 as an example for explanation, the mode of deformation has to be controlled so that the projections 122a, 132a are inwardly deformed by the pressure exerted on the projections 122a, 132a in the direction illustrated as arrow F in the drawings. Also, the influence of the deformation of the projections 122a, 132a appears on the outer circumferential portions of the IC cards 121, 131, thus impairing their appearances.

In prior art structure 4, an unfavorable influence on the appearance of the IC card 141 occurs because the projections 142a are formed on the outside edge portions of the frame 142, and because the projections are pressed and deformed directly with the hot press 149.

In prior art structure 5, it is generally difficult to obtain a stable fixing force sufficient to withstand long-term use because the hooks, tongues, or the like provided on the metal panels are simply engaged with or pressed into the frame.

The present invention has been made considering the above problems, and is intended to provide an IC card and a manufacturing method thereof, wherein the upper and lower panel members are fixed to the resin frame in a way which provides high reliability, reduced manufacturing costs, and favorable appearance.

SUMMARY OF THE INVENTION

To achieve the above objects, and according to a first aspect of the present invention, an IC card includes a pair of upper and lower panel members covering the plane portions of the card which are fixed to the top and bottom surfaces of a resin frame forming the exterior of the card, projections projecting upward or downward and having a given height are formed at a given distance inwardly from the outside edges of the frame; cut-outs capable of fitting on the projections are provided on the panel members; and the panel members are assembled on the top and bottom surfaces of the frame with the cut-outs fitted on the corresponding projections and a portion of each projection is then deformed by the pressing on the panel members from above and below under a predetermined condition so that the panel members are riveted to the top and bottom surfaces of the frame, respectively.

According to a second aspect of the present invention, the side portions of the panel members extending longitudinally are bent generally by 180 degrees; the cut-outs are provided on the folded portions; and a given gap is provided between the folded portion and the panel body.

Furthermore, according to a third aspect of the present invention, a depression opening upward or downward is provided on the root portion of the projection.

Furthermore, according to a fourth aspect of the present invention, the projections and the cut-outs are plurally provided along the longitudinal directions of the frame and of the panel members, respectively.

Furthermore, according to a fifth aspect of the present invention, an IC card includes a pair of upper and lower panel members covering the plane portions of the card which are fixed to the top and bottom surfaces of a resin frame forming the exterior of the card, depressions recessed upward or downward and having a given depth are formed at a given distance inwardly from the outside edges of the frame; fixing portions capable of fitting in the depressions are provided on each panel member; and the panel members are assembled on the top and bottom surfaces of the frame with the fixing portions fitted in the corresponding depressions and at least a portion of the circumference of each depression is then deformed by the pressing on the panel members from above and below under a predetermined condition so that the panel members are riveted to the top and bottom surfaces of the frame, respectively.

Furthermore, according to a sixth aspect of the present invention, a protrusion projecting upward or downward and having a given height is provided at least on a part of the circumference of the depression, and the protrusion has a section leaning toward the depression.

Furthermore, according to a seventh aspect of the invention, the side portions of the panel members extending longitudinally are bent generally by 180 degrees; the fixing portions are provided in the folded portions; and a given gap is provided between the folded portion and the panel body.

Furthermore, according to an eighth aspect of the present invention, the fixing portions are formed with openings provided on bent portions which have been formed by bending the side portions extending longitudinally of the panel members generally by 90 degrees.

Furthermore, according to a ninth aspect of the present invention, the fixing portion is comprised of a bent portion formed by bending the side portion extending longitudinally of the panel member generally by 90 degrees and of a folded portion formed by folding back the edge of the bent portion toward the panel body, and a given gap is provided between the folded portion and the bent portion.

Furthermore, according to a tenth aspect of the present invention, the depressions and the fixing portions are plurally provided along the longitudinal directions of the frame and of the panel members, respectively.

Furthermore, according to an eleventh aspect of the present invention, a method of manufacturing an IC card fixes a pair of upper and lower panel members covering the plane portions of the card to the top and bottom surfaces of a resin frame forming the exterior of the card, projections projecting upward or downward and having a given height are formed at a given distance inwardly from the outside edges of the frame; cut-outs capable of fitting on the projections are provided on the panel members; and the panel members are assembled on the top and bottom surfaces of the frame with the cut-outs fitted on the corresponding projections and a portion of each projection is then deformed by the pressing on the panel members from above and below under a predetermined condition so that the panel members are riveted to the top and bottom surfaces of the frame, respectively.

Furthermore, according to a twelfth aspect of the present invention, a method of manufacturing an IC card fixes a pair of upper and lower panel members covering the plane portions of the card to the top and bottom surfaces of a resin frame forming the exterior of the card, depressions recessed upward or downward and having a given depth are formed at a given distance inwardly from the outside edges of the frame; fixing portions capable of fitting in the depressions are provided on each panel member; and the panel members are assembled on the top and bottom surfaces of the frame with the fixing portions fitted in the corresponding depressions and at least a portion of the circumference of each depression is then deformed by the pressing on the panel members from above and below under a predetermined condition so that the panel members are riveted to the top and bottom surfaces of the frame, respectively.

Furthermore, according to a thirteenth aspect of the present invention, the press process in which the panel members are pressed from above or below is executed at a predetermined temperature resulting from heating.

Furthermore, according to a fourteenth aspect of the present invention, the press process in which the panel members are pressed from above or below is executed concurrently with the application of ultrasonic vibrations.

DETAILED DESCRIPTION OF THE PREFERRED EMBODIMENTS

Embodiment 1

Figure 1:
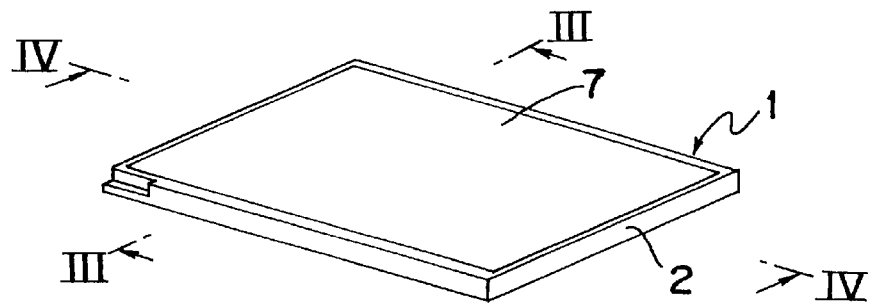
FIG. 1 is a general perspective view illustrating an IC card in accordance with an embodiment 1 of the present invention.
Figure 2:
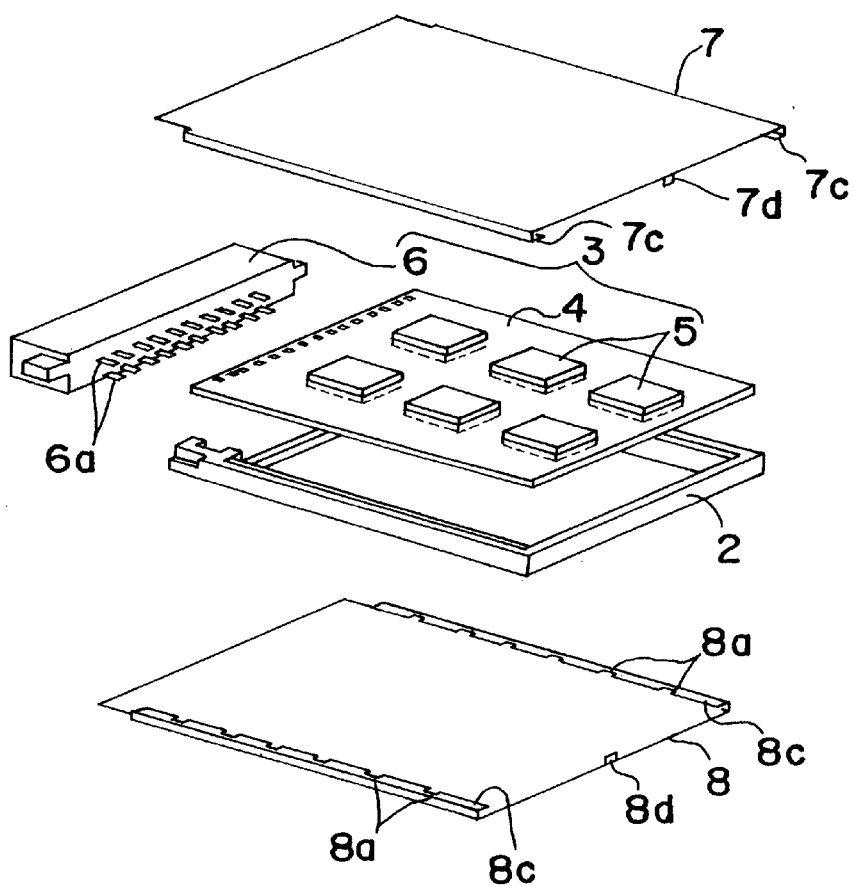
FIG. 2 is an exploded view in perspective illustrating the IC card in accordance with the embodiment 1.

Hereinafter, embodiments of the invention will be described in detail referring to the appended drawings. FIG. 1 is a general perspective view illustrating an IC card 1 in accordance with embodiment 1 of the present invention, and FIG. 2 is an exploded view in perspective illustrating the IC card 1.

As shown in these drawings, the IC card 1 comprises a resin frame 2 constituting the exterior of the card body, an electric circuit board 4 having specific electronic parts and the like 5 incorporated therein, a connector 6 mounted to one end of the electric circuit board 4, and a pair of metal panels 7, 8 covering the upper and lower sides (the face and the back side) of the card 1 containing the electric circuit board 4 and the connector 6.

The connector 6 is to be electrically connected to equipment (such as a personal computer) for which the IC card 1 is used, to send and receive signals, and the connector is positioned on one side surface (the front side surface) of the IC card 1 facing in the longitudinal direction. The electronic parts and the like 5 and the connector 6 are electrically and mechanically joined to the electric circuit board 4 by a technique such as soldering, and a unitary module 3 is thereby constituted. The electric circuit board 4 and the connector 6 are connected to each other through a large number of metal conductors 6a. The frame 2 is constituted as one piece by resin-molding.

The IC card 1 is assembled by incorporating the module 3 into the frame 2 and then fixing the metal panels 7, 8 to the top and bottom surfaces of the frame 2, respectively.

Figure 5:
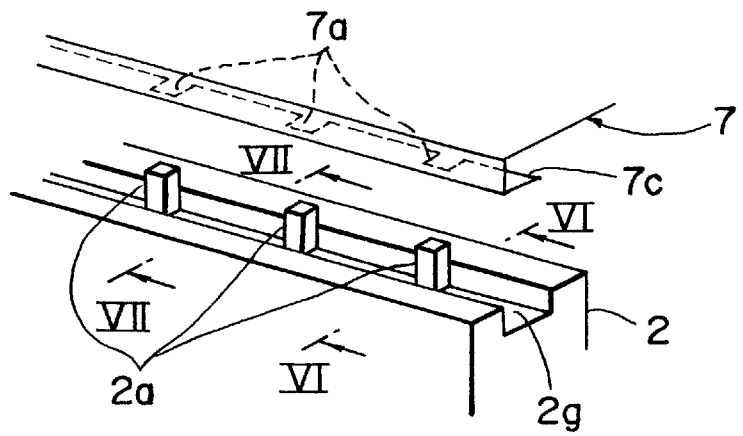
FIG. 5 is an enlarged perspective view illustrating the top surface of a frame and a side portion of an upper metal panel in the IC card in accordance with the embodiment 1.
Figure 6:
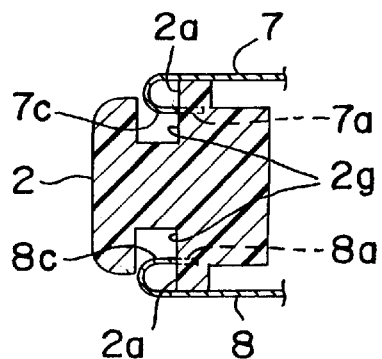
FIG. 6 is an illustrative section taken along the line VI—VI of FIG. 5 and illustrating the IC card in accordance with the embodiment 1 in which the upper and lower metal panels have been jointed with the top and bottom surfaces of the frame.
Figure 7:
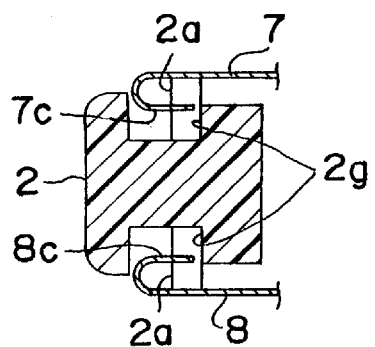
FIG. 7 is an illustrative section taken along the line VII—VII of FIG. 5 and illustrating the IC card in accordance with the embodiment 1 in which the upper and lower metal panels have been jointed with the top and bottom surfaces of the frame.

A structure for fixing the metal panels 7, 8 to the frame 2 will next be described. In this embodiment, as shown in detail in FIGS. 5 to 7, grooves 2g extending in the longitudinal direction of the frame 2 are formed at a given distance inwardly from the outside edges of the frame 2 on the top and bottom surfaces of the frame 2, and projections 2a projecting upward or downward and having a given height are provided in the grooves 2g.

The projections 2a, for example, have a pillar-like shape with a rectangular cross-section and project upward or downward from the top or bottom surface of the frame 2 by a given dimension. Along the longitudinal direction of the frame 2 are provided a plurality of projections 2a.

The side portions of the metal panels 7, 8 extending longitudinally are bent generally by 180 degrees. In the folded portions 7c, 8c are provided a plurality of cut-outs 7a, 8a capable of fitting on the projections 2a, and between the folded portion 7c, 8c and the panel body 7, 8 is provided a given gap, for example, set to not less than 0.1 mm. On the rear side ends of the metal panels 7, 8 are provided lugs 7d, 8d, respectively, which have been formed by bending the panels by 90 degrees.

The metal panels 7, 8 are fixed to the top and bottom surfaces of the frame 2 by fitting each cut-out 7a, 8a provided on the metal panels 7, 8 on the corresponding projection 2a to joint the panels 7, 8 with the top and bottom surfaces of the frame 2 and by pressing each panel 7, 8 from above or below, for example, in a constant temperature bath heated to and kept at a predetermined temperature. On the rear side ends of the assembled metal panels 7, 8, the lugs 7d, 8d fit in slits 2s defined on the frame 2.

Figure 3:
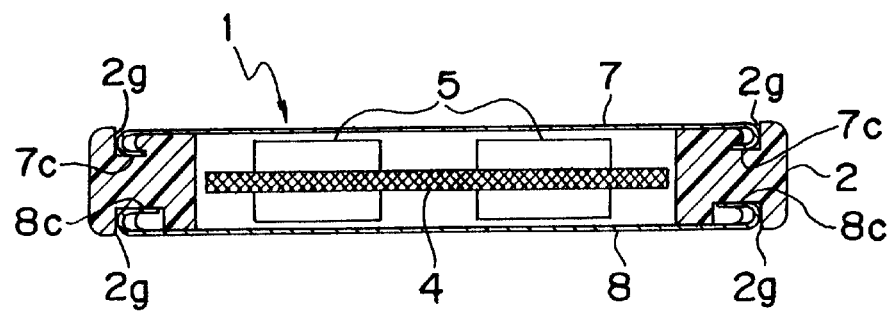
FIG. 3 is an illustrative section taken along the line III—III of FIG. 1.
Figure 4:
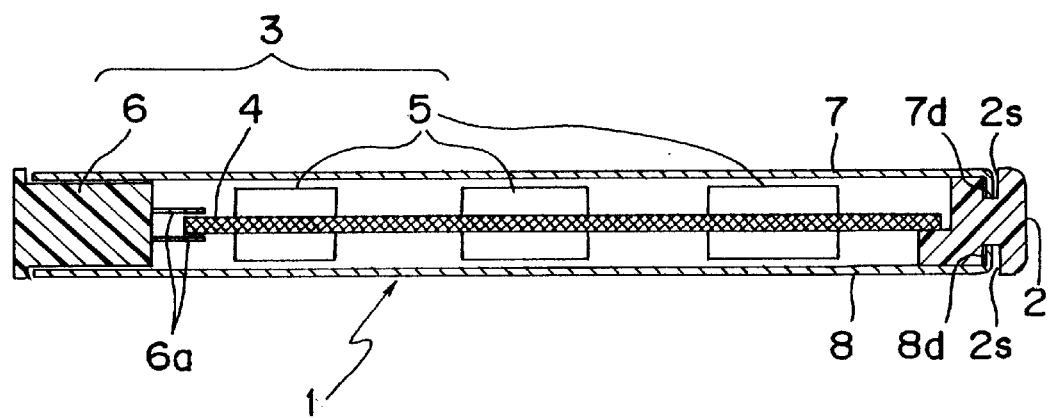
FIG. 4 is an illustrative section taken along the line IV—IV of FIG. 1.

That is, the press at the predetermined temperature causes the tips of the projections 2a provided on the frame 2 to melt and soften and, as shown in FIGS. 3 and 4, the melted resin deforms and intrudes into the gaps formed between the folded portions 7c, 8c of the panels 7, 8 and the panel bodies 7, 8, so that the side portions of the metal panels 7, 8 are tightly riveted to the top and bottom surfaces of the frame 2.

In accordance with embodiment 1, as described above, it is not necessary to mold the metal panels 7, 8 and the resin frame 2 integrally in advance like prior art structure 1 because the metal panels 7, 8 are riveted to the top and bottom surfaces of the frame 2, respectively, by the deformation of a portion of each projection 2a provided on the frame 2. Thus, the manufacturing cost can be reduced as compared with the prior art because such an adhesive sheet as used in prior art structure 2 is not required. Also, a fixing force sufficient to withstand a long-term use can be stably obtained as compared with the fixation achieved simply by engagement or press-fit as in prior art structure 5. In the embodiment, furthermore, the riveted portions do not appear on the outer circumferential portion of the frame 2 as in prior art structures 3 and 4, i.e., the appearance of the card is not impaired, because the projections 2a are provided at a given distance inwardly from the outside edges of the frame 2.

Further, in accordance with embodiment 1, the side portions of the metal panels 7, 8 extending longitudinally are bent generally by 180 degrees; the cut-outs 7a, 8a capable of fitting on the projections 2a are provided in the folded portions 7c, 8c; and a given gap is provided between the folded portion 7c, 8c and the metal panel body 7, 8. As a result, when the metal panels 7, 8 are riveted to the frame 2 by deforming a portion of each projection 2a, the deformed resin intrudes into the gaps, and thus tighter fixation is obtained.

Furthermore, in accordance with embodiment 1, the positioning can be done more accurately when the metal panels 7, 8 are assembled with the top and bottom surfaces of the frame 2, because a plurality of projections 2a and a plurality of cut-outs 7a, 8a are provided along the longitudinal directions of the frame 2 and of the metal panels 7, 8, respectively; and the metal panels 7, 8 can be more tightly fixed to the frame 2 because each side portion of the metal panels 7, 8 is fixed at a plurality of positions. That is, the stiffness of the IC card can be increased.

In addition, the press process in which the metal panels 7, 8 are pressed from above or below is executed at a predetermined temperature resulting from heating, and therefore a portion (the projections 2a) of the frame 2 can be melted and softened, for example, in a constant temperature bath heated to and accurately kept at a predetermined temperature. That is, the metal panels 7, 8 can be pressed from above or below under an accurate temperature control with regard to temperature conditions according to the material of the frame 2 and according to the limitation of the heat resistance of the module 3 in the IC card.

Embodiment 2

An embodiment 2 of the present invention will next be described. In the following description, the same elements as in embodiment 1 are designated by the same numerals and further description on such elements is omitted.

Figure 8:
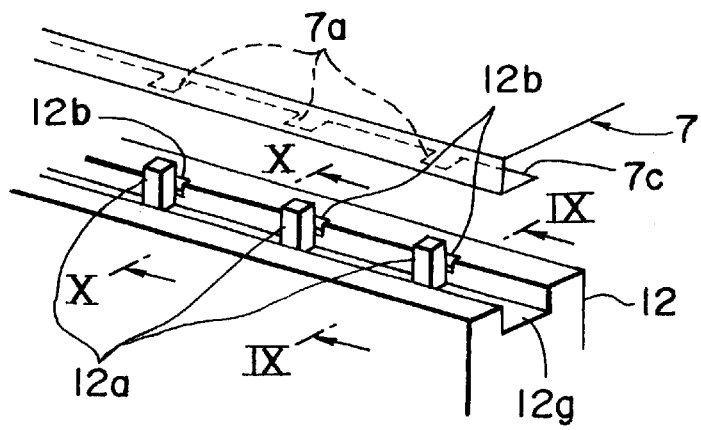
FIG. 8 is an enlarged perspective view illustrating the top surface of a frame and a side portion of an upper metal panel in an IC card in accordance with an embodiment 2 of the present invention.
Figure 9:
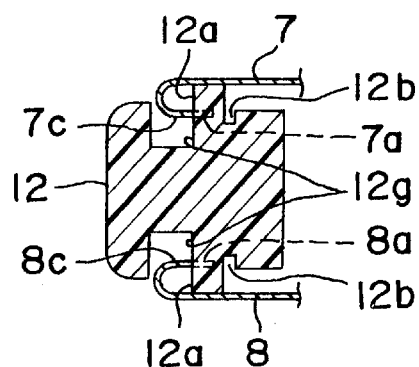
FIG. 9 is an illustrative section taken along the line IX—IX of FIG. 8 and illustrating the IC card in accordance with the embodiment 2 in which the upper and lower metal panels have been jointed with the top and bottom surfaces of the frame.
Figure 10:
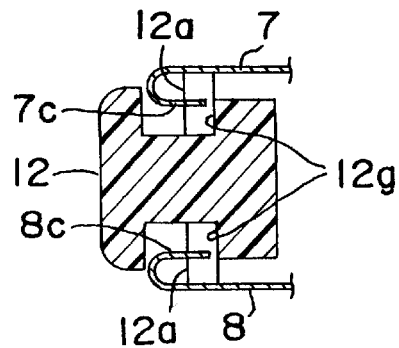
FIG. 10 is an illustrative section taken along the line X—X of FIG. 8 and illustrating the IC card in accordance with the embodiment 2 in which the upper and lower metal panels have been jointed with the top and bottom surfaces of the frame.

In embodiment 2, as shown in FIGS. 8 to 10, root depressions 12b opening upward or downward are provided at the root portion of projections 12a formed in grooves 12g on a frame 12, specifically, at the root with respect to the top or bottom surface of the frame 12.

When metal panels 7, 8 are riveted to the frame 12 by the deformation of a portion of each projection 12a and the deformed and softened resin is to intrude between the metal panels 7, 8 and the top or bottom surface of the frame 12, the softened resin is first received into the base depressions 12b.

That is, in accordance with embodiment 2, basically the same effects as embodiment 1 can be realized and, additionally, the deformed and softened resin can be restrained from intruding between the metal panels 7, 8 and the top or bottom surface of the frame 12, so that the intimacy of the contact between the metal panels 7, 8 and the frame 12 can be increased.

Embodiment 3

Figure 11:
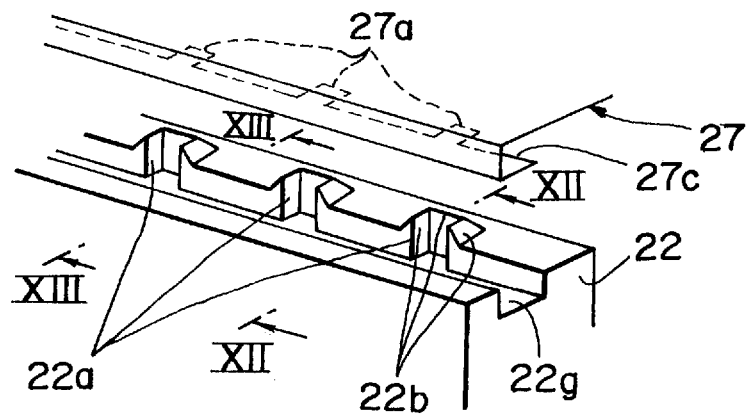
FIG. 11 is an enlarged perspective view illustrating the top surface of a frame and a side portion of an upper metal panel in an IC card in accordance with an embodiment 3 of the present invention.
Figure 12:
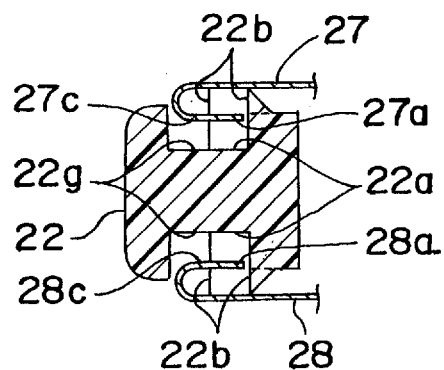
FIG. 12 is an illustrative section taken along the line XII—XII of FIG. 11 and illustrating the IC card in accordance with the embodiment 3 in which the upper and lower metal panels have been jointed with the top and bottom surfaces of the frame.
Figure 13:
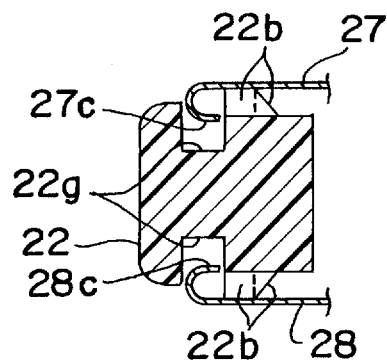
FIG. 13 is an illustrative section taken along the line XIII—XIII of FIG. 11 and illustrating the IC card in accordance with the embodiment 3 in which the upper and lower metal panels have been jointed with the top and bottom surfaces of the frame.

An embodiment 3 of the present invention will next be described. In embodiment 3, as shown in FIGS. 11 to 13, grooves 22g extending in the longitudinal direction of the frame 22 and having a given depth are formed at a given distance inwardly from the outside edges of the frame 22 on the top and bottom surfaces of the frame 22, and depressions 22a having a given depth (e.g., the same depth as the grooves 22g) and recessed downward or upward from the top or bottom surface of the frame 22 are provided inside the grooves 22g. The circumferential shape of the cross section of the depression 22a is formed like a square bracket opening on to the groove 22g; along the longitudinal direction of the frame 22 are provided a plurality of depressions 22a.

On the circumference of each depression 22a is provided a protrusion 22b projecting upward or downward and having a given height, and the protrusion 22b has a section leaning toward the depression 22a (such as right triangle or trapezoid having the oblique side opposed to the depression). With such a shape of the protrusion 22b, when the protrusions 22b are deformed by pressure from above or below, almost all of the deformed resin intrudes into the depressions 22a without spreading over the top or bottom surface of the frame 22.

In this embodiment, more preferably, each protrusion 22b is formed on the entire circumference (three sides) of each depression 22a. However, each protrusion may be provided at least on a part of the circumference of each depression with the size or depth of the depressions set properly.

The side portions of the upper and lower metal panels 27, 28 extending longitudinally are bent generally by 180 degrees. On the folded portions 27c, 28c are provided a plurality of lug-like fixing portions 27a, 28a capable of fitting into the depressions 22a of the frame 22, and between the folded portion 27c, 28c and the panel body 27, 28 is provided a given gap, for example, set to not less than 0.1 mm.

In this case, the lug-like fixing portions 27a, 28a are provided on the terminal sides of the folded portions 27c, 28c, thereby increasing the largest length of the bent areas of the folded portions 27c, 28c, so that the working stability can be increased when the bending work is performed with a press.

The metal panels 27, 28 are fixed to the top and bottom surfaces of the frame 22 by fitting each fixing portion 27a, 28a provided on the metal panels 27, 28 into the corresponding depression 22a to assemble the panels 27, 28 with the top and bottom surfaces of the frame 22 and by pressing the metal panels 27, 28 from above and below, for example, in a constant temperature bath heated to and kept at a predetermined temperature.

That is, the press at the predetermined temperature causes the protrusions 22b provided on the frame 22 to melt and soften and, in the same way as the embodiment 1 (as shown in FIGS. 3 and 4), the softened resin deforms and intrudes into the gaps formed between the folded portions 27c, 28c of the metal panels 27, 28 and the panel bodies 27, 28, so that the metal panels 27, 28 are tightly riveted to the top and bottom surfaces of the frame 22.

In accordance with embodiment 3, as described above, it is not necessary to mold the metal panels 27, 28 and the resin frame 22 integrally in advance like prior art structure 1 because the metal panels 27, 28 are riveted to the top and bottom surfaces of the frame 22, respectively, by the deformation of at least a portion of the circumference of each depression 22a provided on the frame 22. The manufacturing cost can be reduced as compared with the prior art because such an adhesive sheet as used in prior art structure 2 is not required. Also, a fixing force sufficient to withstand long-term use can be stably obtained as compared with the fixation achieved simply by engagement or press-fit as in prior art structure 5. In the embodiment, furthermore, the riveted portions do not appear on the outer circumferential portion of the frame 22 as in prior art structures 3 and 4, i.e., the appearance of the card is not impaired, because the depressions 22a are provided at a given distance inwardly from the outside edges of the frame 22.

Further, in accordance with embodiment 3, each protrusion 22b projecting upward or downward and having a given height is provided at least on a part of the circumference of each depression 22a, and the protrusion 22b has a section leaning toward the depression 22a. As a result, when the metal panels 27, 28 are riveted to the frame 22, the fluid resin resulted from the deformation of the protrusions 22b is prone to intrude into the depressions 22a, and thus tighter fixation is achieved.

Furthermore, in accordance with embodiment 3, the side portions of the metal panels 27, 28 extending longitudinally are bent generally by 180 degrees; the fixing portions 27a, 28a are provided on the folded portions 27c, 28c; and a given gap is provided between the folded portion 27c, 28c and the metal panel body 27, 28. As a result, when the metal panels 27, 28 are riveted to the frame 22 by the deformation of at least a portion of the circumference of each depression 22a, the deformed resin intrudes into the gap, and thus tighter fixation is achieved.

Furthermore, in accordance with embodiment 3, the positioning can be done more accurately when the metal panels 27, 28 are assembled with the top and bottom surfaces of the frame 22, because a plurality of depressions 22a and a plurality of fixing portions 27a, 28a are provided along the longitudinal directions of the frame 22 and of the metal panels 27, 28, respectively; and the metal panels 27, 28 can be more tightly fixed to the frame 22, i.e., the rigidity of the IC card can be increased, because each side portion of the metal panels 27, 28 is riveted at a plurality of positions.

In addition, the press process in which the metal panels 27, 28 are pressed from above and below is executed at a predetermined temperature resulting from heating, and therefore a portion (the depressions 22a) of the frame 22 can be melted and softened, for example, in a constant temperature bath heated to and accurately kept at a predetermined temperature. That is, the metal panels 27, 28 can be pressed from above and below under an accurate temperature control with regard to temperature conditions according to the material of the frame 22 and according to the limitation of the heat resistance of the module 3 in the IC card.

Embodiment 4

Figure 14:
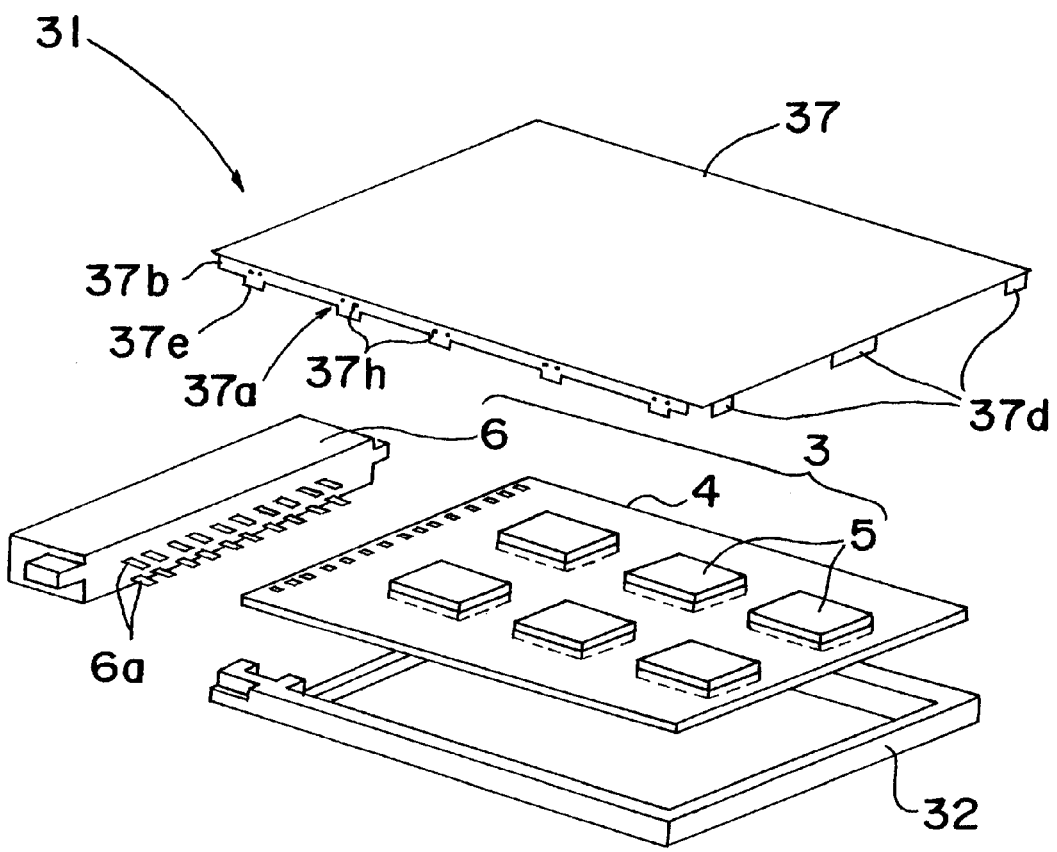
FIG. 14 is an exploded view in perspective illustrating an IC card in accordance with an embodiment 4 of the present invention.
Figure 15:
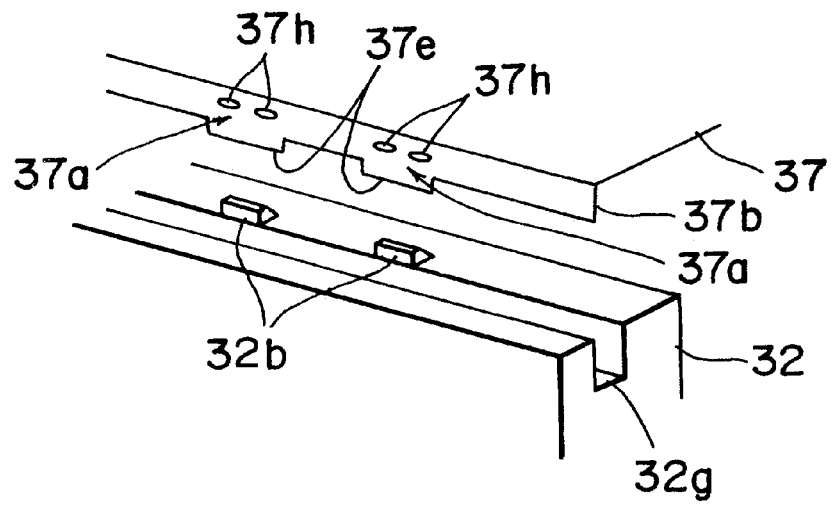
FIG. 15 is an enlarged perspective view illustrating the top surface of a frame and a side portion of an upper metal panel in the IC card in accordance with the embodiment 4.
Figure 16:
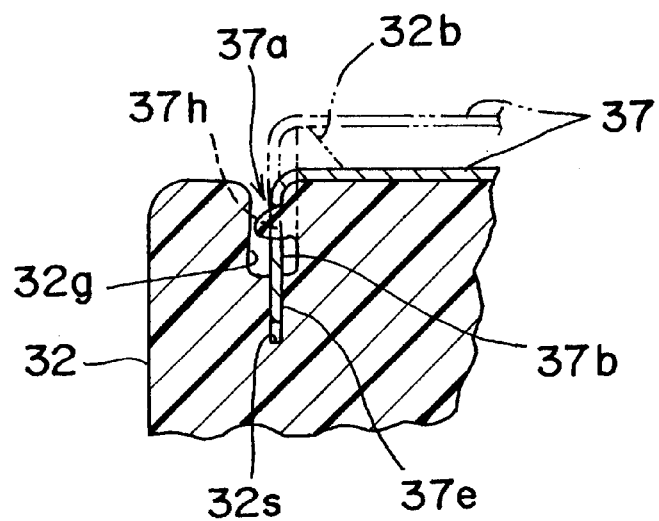
FIG. 16 is an enlarged illustrative section illustrating the IC card in accordance with the embodiment 4 in which a side portion of the upper metal panel has been fixed to the top surface of the frame.

An embodiment 4 of the invention will next be described. In an IC card 31 according to embodiment 4, as shown in FIGS. 14 to 16, the side portions of upper and lower metal panels 37, 38 extending longitudinally are bent generally by 90 degrees. Openings 37h, 38h are provided in the bent portions 37b, 38b, and thus fixing portions 37a, 38a are formed. Along the longitudinal directions of the metal panels 37, 38 are provided a plurality of fixing portions 37a, 38a. As will be described below, tongues 37e, 38e to be press-fitted into a frame 32 are formed on the lower or upper part of the fixing portions 37a, 38a.

On the rear side ends of the metal panels 37, 38 are provided a plurality of lugs 37d, 38d, which are to be fitted into slits (not shown) provided on the rear side of the frame 32 in the same way as embodiment 1 (see FIG. 4).

Grooves 32g extending in the longitudinal direction of the frame 32 and having a given depth are formed at a given distance inwardly from the outside edges of the frame 32 on the top and bottom surfaces of the frame 32. In this embodiment, the grooves 32g constitute depressions into which the fixing portions 37a, 38a are to be fitted.

On the circumference of the portion of the groove (depression) 32g corresponding to each fixing portion 37a, 38a is provided a protrusion 32b projecting upward or downward and having a given height, and the protrusion 32b has a section leaning toward the groove 32g (such as right triangle or trapezoid having the oblique side opposed to the groove). With such a shape of the protrusions 32b, when the protrusions 32b are deformed by pressure from above or below, almost all of the deformed resin intrudes into the grooves 32g without spreading over the top or bottom surface of the frame 32.

As shown in FIG. 16, taking the upper side of the frame 32 as an example, slits 32s for press-fit are more preferably formed at the bottom surface of the portions of the grooves (depressions) 32g corresponding to the fixing portions 37a, 38a so that the tongues 37e, 38e formed on the lower or upper part of the fixing portions 37a, 38a can be press-fitted into the slits and thereby fixed.

The panels 37, 38 are fixed to the top and bottom surfaces of the frame 32 by pressing the tongues 37e, 38e of the fixing portions 37a, 38a provided on the metal panels 37, 38 into the corresponding slits 32s for press-fit to a certain extent to assemble the panels 37, 38 with the top and bottom surfaces of the frame 32 and by pressing the metal panels 37, 38 from above and below, for example, in a constant temperature bath heated to and kept at a predetermined temperature.

That is, the press at the predetermined temperature causes the protrusions 32b provided on the frame 32 to melt and soften; as shown in FIG. 16, the softened resin deforms and intrudes into the grooves 32g while penetrating the openings 37h, 38h of the fixing portions 37a, 38a of the panels 37, 38; and the panels 37, 38 are thereby tightly riveted to the top and bottom surfaces of the frame 32. At this time, the tongues 37e, 38e are pressed into the corresponding slits 32s for press-fit to a certain depth, so that the metal panels 37, 38 are further tightly fixed to the frame 32.

In accordance with embodiment 4, as described above, the fixing portions 37a, 38a are formed with the openings 37h, 38h provided on the bent portions 37b, 38b which have been formed by bending the side portions extending longitudinally of the metal panels 37, 38 generally by 90 degrees, i.e., the side portions of the metal panels 37, 38 are formed with one bending, so that the process of manufacturing the metal panels can be simplified. In this case, the fluid resin resulted from the deformation of a portion of the circumference of the depression (the groove 32g) formed on the frame 32 penetrates the openings 37h, 38h provided on the metal panels 37, 38, thereby causing a tight fixation.

In embodiment 4, the same functional effects as embodiment 3 can be obtained except for the effects concerning the shape of the bend of the side portions of the metal panels 37, 38 extending longitudinally and the shape of the depressions (the grooves 32g) on the frame 32.

Embodiment 5

Figure 17:
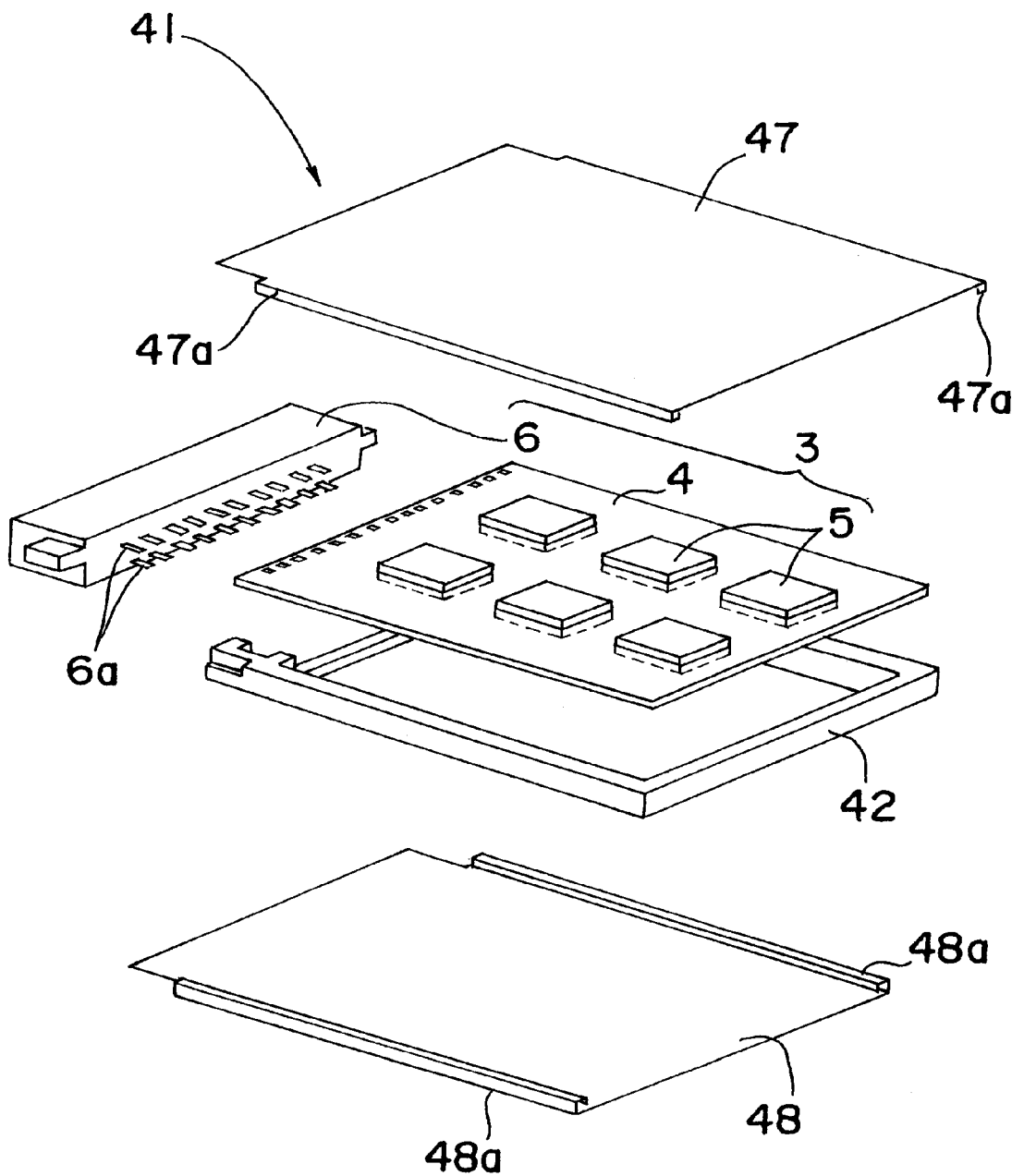
FIG. 17 is an exploded view in perspective illustrating an IC card in accordance with an embodiment 5 of the present invention.
Figure 18:
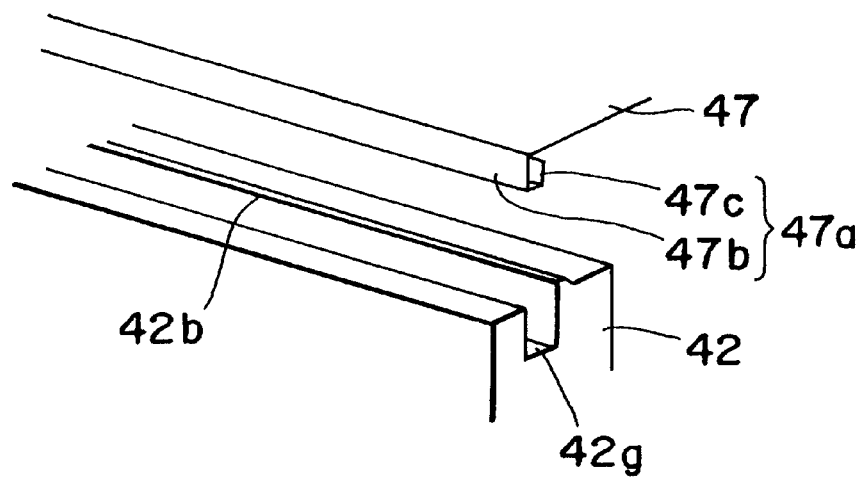
FIG. 18 is an enlarged perspective view illustrating the top surface of a frame and a side portion of an upper metal panel in the IC card in accordance with the embodiment 5.
Figure 19:
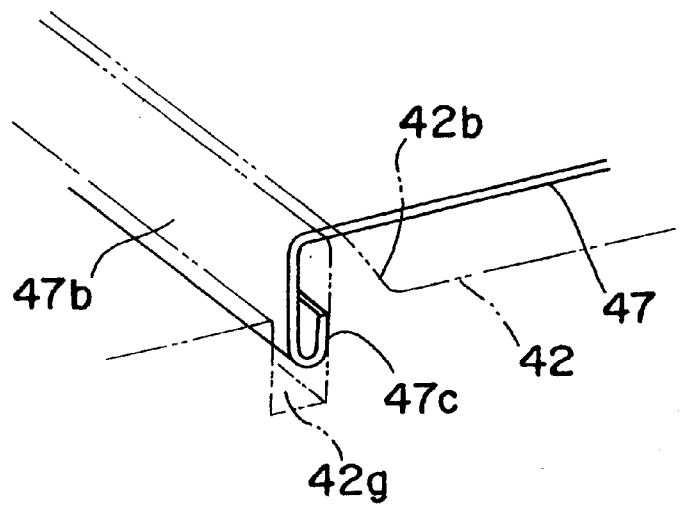
FIG. 19 is an enlarged perspective view illustrating the side portion of the upper metal panel in the IC card in accordance with the embodiment 5.
Figure 20:
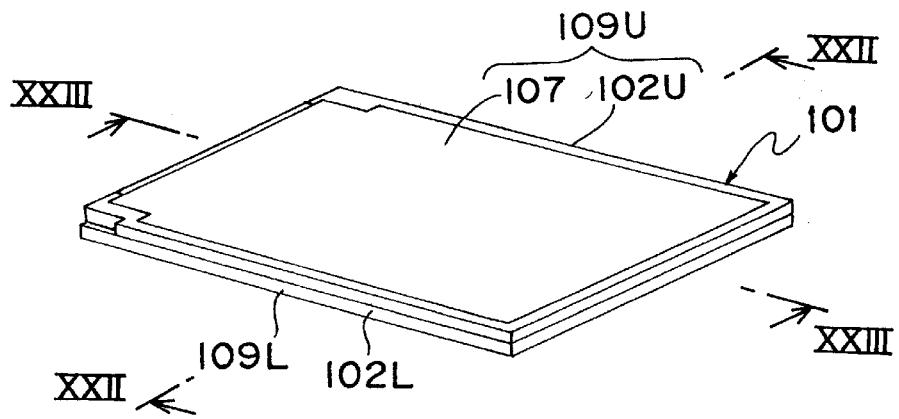
FIG. 20 is a general perspective view illustrating an IC card in accordance with prior art structure 1.
Figure 21:
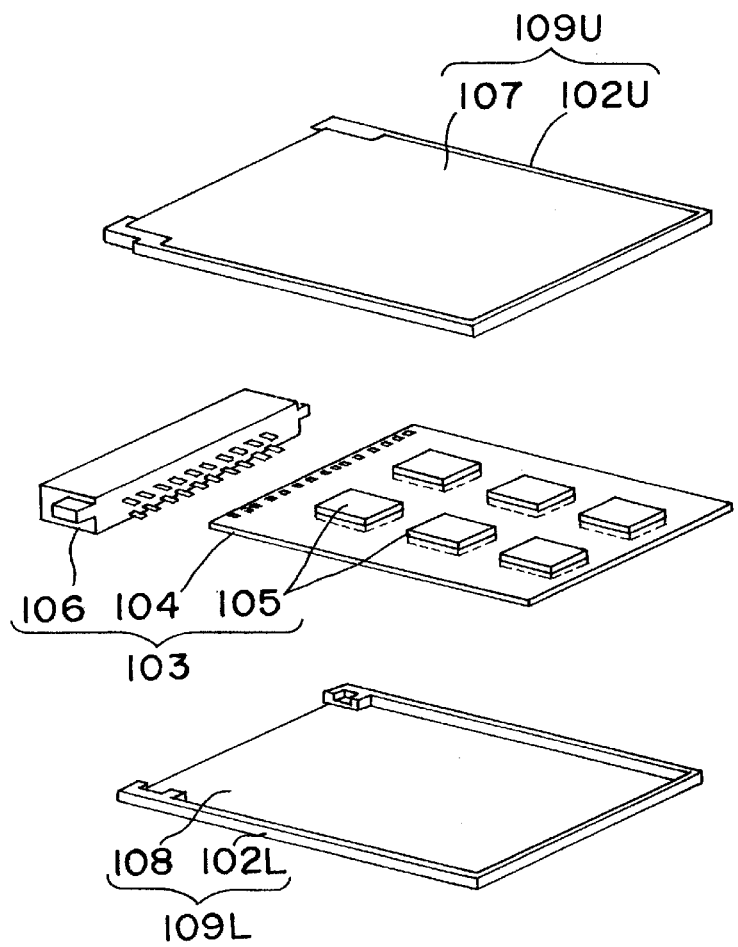
FIG. 21 is an exploded view in perspective illustrating the IC card in accordance with prior art structure 1.
Figure 22:
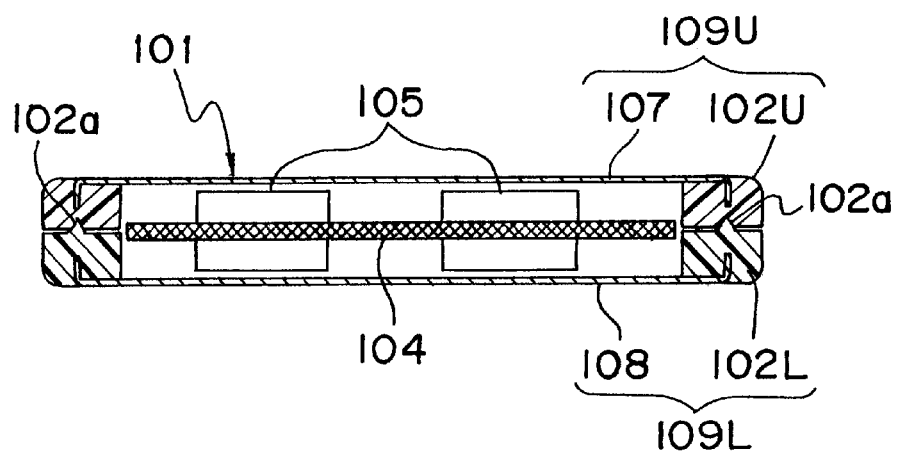
FIG. 22 is an illustrative section taken along the line XXII—XXII of FIG. 20.
Figure 23:
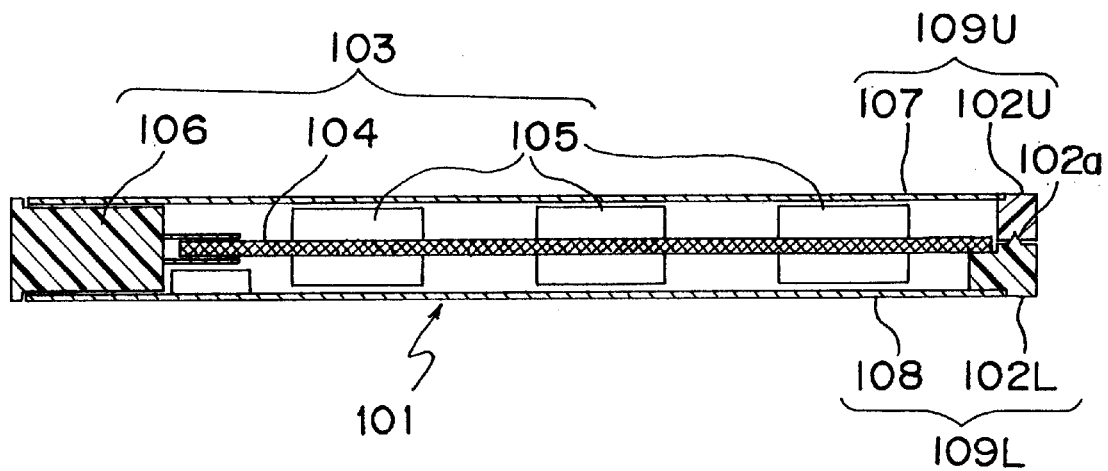
FIG. 23 is an illustrative section taken along the line XXIII—XXIII of FIG. 20.
Figure 24:
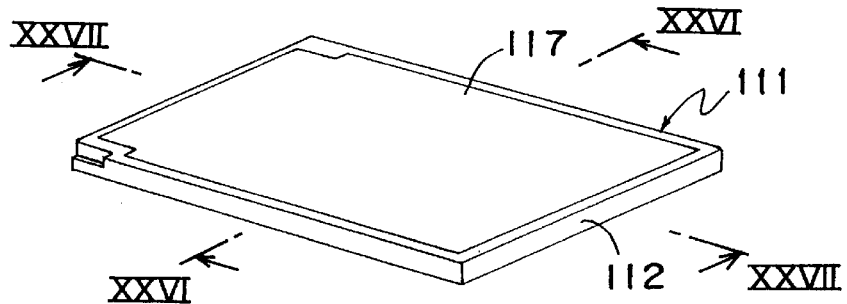
FIG. 24 is a general perspective view illustrating an IC card in accordance with prior art structure 2.
Figure 25:
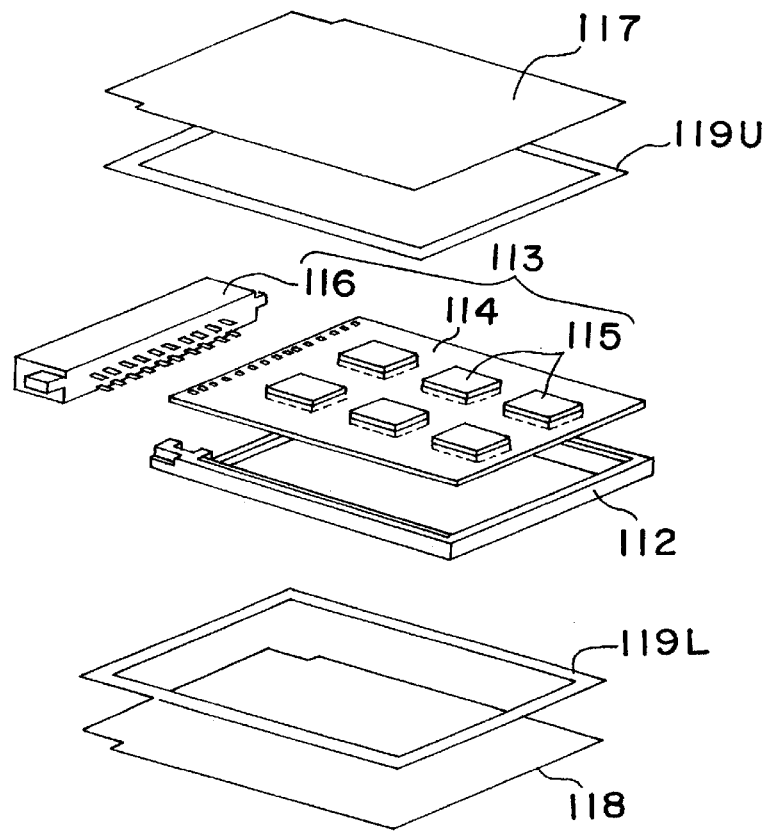
FIG. 25 is an exploded view in perspective illustrating the IC card in accordance with prior art structure 2.
Figure 26:
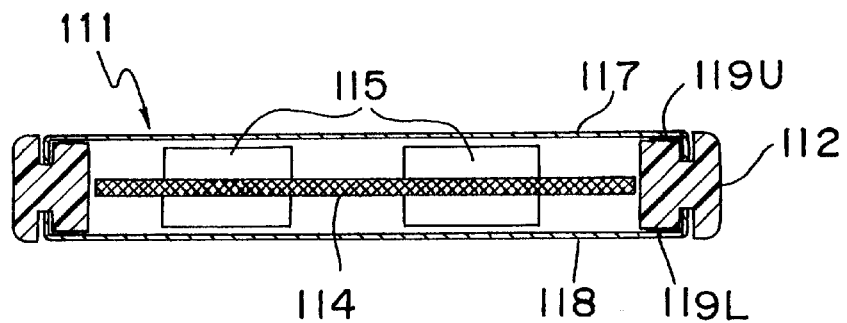
FIG. 26 is an illustrative section taken along the line XXVI—XXVI of FIG. 24.
Figure 27:
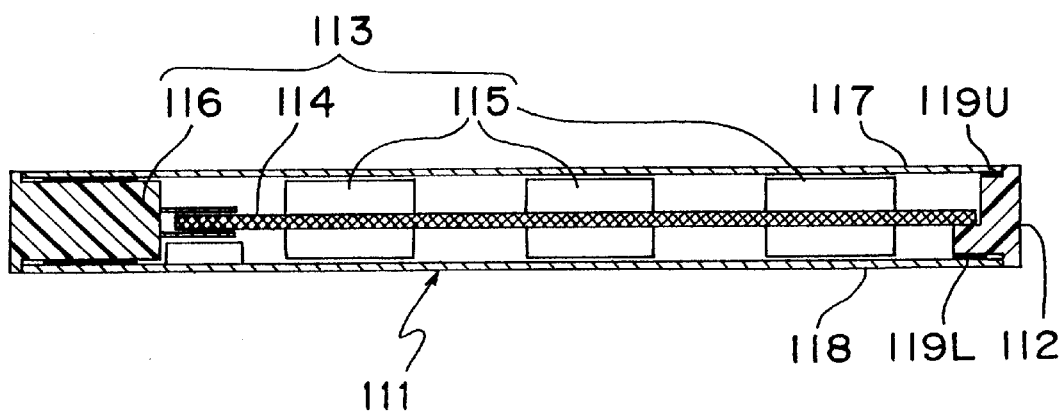
FIG. 27 is an illustrative section taken along the line XXVII—XXVII of FIG. 24.
Figure 28:
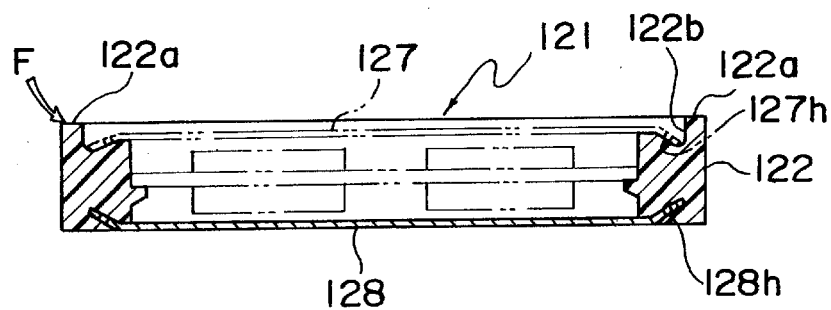
FIG. 28 is an illustrative section of an IC card in accordance with prior art structure 3.
Figure 29:
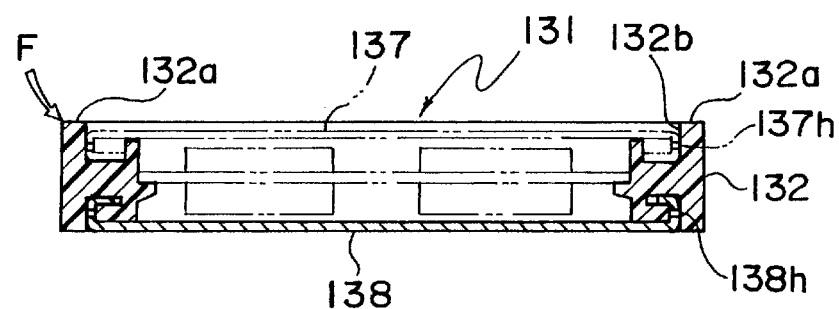
FIG. 29 is an illustrative section of an IC card in accordance with a modification of prior art structure 3.
Figure 30:
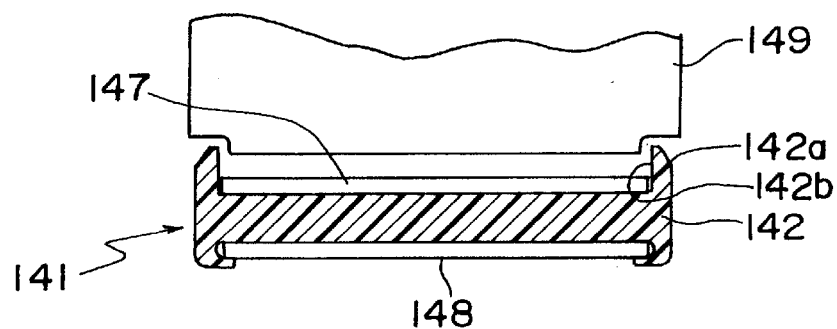
FIG. 30 is an illustrative section of an IC card in accordance with prior art structure 4.

An embodiment 5 of the present invention will next be described. In an IC card 41 according to embodiment 5, as shown in FIGS. 17 to 19, the side portions of upper and lower metal panels 47, 48 extending longitudinally are bent generally by 90 degrees. Taking the upper metal panel 47 as an example (see FIGS. 18 and 19), the edges of the bent portions 47b are folded back toward the panel body 47, and thus folded portions 47c are formed. Between the folded portion 47c and the bent portion 47b is provided a given gap, for example, set to not less than 0.1 mm. In this embodiment, a fixing portion 47a (a fixing portion 48a in the lower metal panel 48: see FIG. 17) is comprised of the folded portion 47c and the bent portion 47b.

As clearly seen from FIG. 19, on the border area between the folded portion 47c and the bent portion 47b has been formed a R (rounded) portion with a given curvature, in press-forming.

Grooves 42g extending in the longitudinal direction of a frame 42 and having a given depth are formed at a given distance inwardly from the outside edges of the frame 42 on the top and bottom surfaces of the frame 42. In this embodiment, the grooves 42g constitute depressions into which the fixing portions 47a, 48a are to be fitted.

On the inside edge of each groove (depression) 42g is provided a continuous protrusion 42b projecting upward or downward and having a given height, and the protrusion 42b has a section leaning toward the groove 42g (such as right triangle or trapezoid having the oblique side opposed to the groove). With such a shape of the protrusions 42b, when the protrusions 42b are deformed by pressure from above or below, almost all of the deformed resin intrudes into the grooves 42g without spreading over the top or bottom surface of the frame 42.

In this embodiment, more preferably, a gap between the folded portion 47c and the bent portion 47b is set so that both the portions may fit into the groove 42g without clearance. With this arrangement, the instability of the metal panels 47, 48 set on the top and bottom surfaces of the frame 42 can be eliminated, so that the working stability during riveting can be increased; and the arrangement contributes to improved rigidity of the IC card.

As described above, on the border area between the folded portion 47c and the bent portion 47b has been formed the R (rounded) portion with a given curvature, in press-forming, and therefore the workability can be maintained satisfactorily when the side portions of the metal panels 47, 48 are fitted into the groove 42g on the frame 42.

The panels 47, 48 are fixed to the top and bottom surfaces of the frame 42 by fitting the fixing portions 47a, 48a provided in the metal panels 47, 48 into the grooves (depressions) 42g on the frame 42 to assemble the panels 47, 48 with the top and bottom surfaces of the frame 42 and by pressing the metal panels 47, 48 from above or below, for example, in a constant temperature bath heated to and kept at a predetermined temperature.

That is, the press at the predetermined temperature causes the protrusions 42b provided on the frame 42 to melt and soften and the softened resin deforms and intrudes into the gaps formed between the folded portions 47c, 48c and the bent portions 47b, 48b of the metal panels 47, 48, so that the metal panels 47, 48 are tightly riveted to the top and bottom surfaces of the frame 42.

In accordance with embodiment 5, as described above, the fixing portion 47a, 48a is comprised of the bent portion 47b, 48b formed by bending the side portion extending longitudinally of the metal panel 47, 48 generally by 90 degrees and of the folded portion 47c, 48c formed by folding back the edge of the bent portion 47b, 48b toward the metal panel body 47, 48, and a given gap is provided between the folded portion 47c, 48c and the bent portion 47b, 48b. As a result, when at least a portion (the protrusion 42b, in the embodiment) of the circumference of each depression (each groove 42g) is deformed for riveting the metal panels 47, 48 to the frame 42, the deformed resin intrudes into the gap so that a more tight fixation can be achieved.

Further, in accordance with embodiment 5, the side portions of the metal panels 47, 48 extending longitudinally are provided with the fixing portions 47a, 48a along almost their entire lengths and riveted along almost their entire lengths, so that the metal panels 47, 48 can be more tightly fixed to the frame 42.

Instead of providing the fixing portions of the metal panels and the grooves of the frame continuously along the entire lengths in the longitudinal directions as described above, a plurality of fixing portions and a plurality of grooves may be provided intermittently along the longitudinal directions of the metal panels 47, 48 and of the frame 42, respectively.

In embodiment 5, the same functional effects as embodiment 3 can be obtained, except for the effects concerning the shape of the bend of the side portions of the metal panels 47, 48 extending longitudinally and the shape of the depressions (the grooves 42g) on the frame 42.

In the above embodiments, the press process in which the upper and lower metal panels are riveted to the frame by assembling the metal panels on the top and bottom surfaces of the frame and then by pressing the metal panels from above and below is executed, for example, in a constant temperature bath heated to and kept at a predetermined temperature. Alternatively, the upper and lower metal panels may be fixed to the top and bottom surfaces of the frame by applying ultrasonic vibrations to the upper and lower metal panels while pressing the panels from above and below, i.e., by ultrasonic welding.

That is, applying ultrasonic vibrations causes a portion (projections or protrusions) of the frame to melt and soften, and the softened resin deforms with press. As a result, the metal panels are riveted tightly to the top and bottom surfaces of the frame.

Such an ultrasonic welding method does not involve heating and retaining the metal panels and frame assembled together, and allows a portion (projections or protrusions) of the frame to melt and soften in a significantly shorter time, as compared with the case in which pressing is performed concurrently with heating and retaining in, for example, a constant temperature bath, thereby increasing the productivity in the card assembling process.

The scope of the present invention should not be limited to the above embodiments because various modifications and changes in the design may be made without departing from the spirit and scope of the invention.

Effects of the Invention

In accordance with the first aspect of the present invention, it is not necessary to mold the panel members and the resin frame integrally in advance because the panel members are riveted to the top and bottom surfaces of the frame, respectively, by the deformation of a portion of each projection provided on the frame, and the manufacturing cost can be reduced as compared with the prior art because adhesive sheets are not required. Also, a fixing force sufficient to withstand long-term use can be stably obtained as compared with the fixation achieved simply by engagement or press-fit. In this case, furthermore, the riveted portions do not appear on the outer circumferential portion of the frame. Thus, the appearance of the card is not impaired because the projections are provided at a given distance inwardly from the outside edges of the frame.

Further, in accordance with the second aspect of the present invention, basically the same effects as the first aspect of the invention can be obtained. Also, the side portions of the panel members extending longitudinally are bent generally by 180 degrees; the cut-outs are provided in the folded portions; and a given gap is provided between the folded portion and the panel body. As a result, when the panel members are riveted to the frame by the deformation of a portion of each projection, the deformed resin intrudes into the gap and thus tighter fixation can be obtained.

Furthermore, in accordance with the third aspect of the present invention, basically the same effects as the first or second aspect of the invention can be attained. Also, depressions opening upward or downward are provided at the root portion of the projections. Therefore, when the panel members are riveted to the frame by the deformation of a portion of each projection and the deformed resin is going to intrude between the panel members and the frame, the softened resin is received into the base depressions 12*b* before the intrusion. That is, the deformed and softened resin can be restrained from intruding between the metal panels 7, 8 and the top or bottom surface of the frame 12, so that the intimacy of the contact between the panel members and the frame can be increased.

Furthermore, in accordance with the fourth aspect of the present invention, basically the same effects as any one of the first to third aspects of the invention can be attained. In particular, the positioning can be done more accurately when the panel members are assembled with the top and bottom surfaces of the frame, because the projections and the cut-outs are plurally provided along the longitudinal directions of the frame and of the panel members, respectively; and the panel members can be more tightly fixed to the frame, i.e., the rigidity of the IC card can be increased, because each side portion of the panel members is fixed at a plurality of positions.

Furthermore, in accordance with the fifth aspect of the present invention, it is not necessary to mold the panel members and the resin frame integrally in advance because the panel members are riveted to the top and bottom surfaces of the frame, respectively, by the deformation of at least a portion of the circumference of each depression provided on the frame, and the manufacturing cost can be reduced as compared with the prior art structures because adhesive sheets are not required. Besides, a fixing force sufficient to withstand long-term use can be stably obtained as compared with the fixation achieved simply by engagement or press-fit. In this case, furthermore, the riveted portions do not appear on the outer circumferential portion of the frame. Thus, the appearance of the card is not impaired, because the depressions are provided at a given distance inwardly from the outside edges of the frame.

Furthermore, in accordance with the sixth aspect of the present invention, basically the same effects as the fifth aspect of the invention can be attained. Besides, a protrusion projecting upward or downward and having a given height is provided at least on a part of the circumference of each depression, and the protrusion has a section leaning toward the depression. As a result, when the panel members are riveted to the frame, the fluid resin resulting from the deformation of the protrusions is prone to intrude into the depressions, and thus tighter fixation can be achieved.

Furthermore, in accordance with the seventh aspect of the present invention, basically the same effects as the fifth or sixth aspect of the invention can be attained. In particular, the side portions of the panel members extending longitudinally are bent generally by 180 degrees; the fixing portions are provided in the folded portions; and a given gap is provided between the folded portion and the panel body. As a result, when the panel members are riveted to the frame by the deformation of at least a portion of the circumference of each depression, the deformed resin intrudes into the gaps and thus more tight fixation can be achieved.

Furthermore, in accordance with the eighth aspect of the invention, basically the same effects as the fifth or sixth aspect of the invention can be attained. In particular, the fixing portions are formed with the openings provided on the bent portions which have been formed by bending the side portions extending longitudinally of the panel members generally by 90 degrees, i.e., the side portions of the panel members are formed with one bending, so that the processes in manufacturing the panel members can be simplified. In this case, the fluid resin resulted from the deformation of a portion of the circumference of each depression formed on the frame penetrates the openings provided on the panel members, and thus tighter fixation can be achieved.

Furthermore, in accordance with the ninth aspect of the present invention, basically the same effects as the fifth or sixth aspect of the invention can be attained. In particular, the fixing portion is comprised of the bent portion formed by bending the side portion extending longitudinally of the panel members generally by 90 degrees and of the folded portion formed by folding back the edge of the bent portion toward the panel body, and a given gap is provided between the folded portion and the bent portion. As a result, when at least a portion of the circumference of each depression is deformed for riveting the panel members to the frame, the deformed resin intrudes into the gaps and thus more tight fixation can be achieved.

Furthermore, in accordance with the tenth aspect of the present invention, basically the same effects as any one of the fifth to ninth aspects of the invention can be attained. In particular, the positioning can be done more accurately when the panel members are assembled with the top and bottom surfaces of the frame, because the depressions and the fixing portions are plurally provided along the longitudinal directions of the frame and of the panel members, respectively. The panel members can be more tightly fixed to the frame, i.e., the stiffness of the IC card can be increased, because each side portion of the panel members is fixed at a plurality of positions.

Furthermore, in accordance with the eleventh aspect of the invention, it is not necessary to mold the panel members and the resin frame integrally in advance because the panel members are riveted to the top and bottom surfaces of the frame, respectively, by the deformation of a portion of each projection provided on the frame. The manufacturing cost can be reduced as compared with the prior art structures because adhesive sheets are not required. Besides, a fixing force sufficient to withstand a long-term use can be stably obtained as compared with the fixation achieved simply by engagement or press-fit. In this case, furthermore, the riveted portions do not appear on the outer circumferential portion of the frame. Thus, the appearance of the card is not impaired, because the projections are provided at a given distance inwardly from the outside edges of the frame.

Furthermore, in accordance with the twelfth aspect of the present invention, it is not necessary to mold the panel members and the resin frame integrally in advance because the panel members are riveted to the top and bottom surfaces of the frame, respectively, by the deformation of at least a portion of the circumference of each depression provided on the frame, and the manufacturing cost can be reduced as compared with the prior art structures because adhesive sheets are not required. Besides, a fixing force sufficient to withstand a long-term use can be stably obtained as compared with the fixation achieved simply by engagement or press-fit. In this case, furthermore, the riveted portions do not appear on the outer circumferential portion of the frame. Thus, the appearance of the card is not impaired, because the depressions are provided at a given distance inwardly from the outside edges of the frame.

Furthermore, in accordance with the thirteenth aspect of the present invention, basically the same effects as the eleventh or twelfth aspect of the invention can be attained. In particular, the press process in which the panel members are pressed from above or below is executed at a predetermined temperature resulting from heating, and therefore a portion (projections or protrusions) of the frame can be melted and softened, for example, in a constant temperature bath heated to and accurately kept at a predetermined temperature. That is, the panel members can be pressed from above or below under an accurate temperature control with regard to temperature conditions according to the material of the frame and according to the limitation of the heat resistance of the module in the IC card.

Furthermore, in accordance with the fourteenth aspect of the present invention, basically the same effects as the eleventh or twelfth aspect of the invention can be attained. In particular, because the press process in which the panel members are pressed from above or below is executed concurrently with the application of ultrasonic vibrations, heating and retaining the panel members and frame assembled together are unnecessary and a portion (projections or protrusions) of the frame can be melted and softened in a significantly shorter time as compared with the case in which pressing is performed concurrently with heating and retaining in, for example, a constant temperature bath. As a result, the productivity in the card assembling process can be increased.

What is claimed is:

1. An IC card comprising:

a resin frame; and upper and lower panel members fixed respectively to top and bottom surfaces of said resin frame to form the exterior of said IC card, wherein projections projecting upward or downward and having a given height are formed at a given distance inwardly from outside edges of said frame;

cut-outs capable of fitting on the projections are provided on said upper and lower panel members; and said upper and lower panel members are positioned respectively on the top and bottom surfaces of the frame with the cut-outs fitted with corresponding projections, a portion of each projection, while in a melted or softened state, having been deformed by one of said upper and lower panel members so that said upper and lower panel members are secured to the top and bottom surfaces of said frame, respectively.

2. An IC card as claimed in claim 1, wherein said upper and lower panel members have side portions which extend longitudinally and are bent by approximately 180 degrees to form folded portions;

the cut-outs are provided in the folded portions; and a given gap is provided between the folded portions and the panel bodies.

3. An IC card as claimed in claim 1, wherein depressions opening upward or downward are provided at the root of the projections.

4. An IC card as claimed in claim 1, wherein a plurality of projections and corresponding cut-outs are provided along the longitudinal directions of said frame and of said upper and lower panel members, respectively.

5. An IC card comprising:

a pair of upper and lower panel members covering plane portions of the card and fixed to the top and bottom surfaces of a resin frame forming the exterior of the card, wherein depressions recessed upward or downward and having a given depth are formed at a given distance inwardly from outside edges of the frame; and fixing portions capable of fitting in the depressions are provided on each panel member, the panel members being positioned on the top and bottom surfaces of the frame with the fixing portions fitted in the corresponding depressions, and at least a portion of the circumference of each depression having been deformed by pressing the panel members from above or below under a predetermined condition so that the panel members are secured to the top and bottom surfaces of the frame, respectively.

6. An IC card as claimed in claim 5, wherein a protrusion projecting upward or downward and having a given height is provided at least on a part of the circumference of each depression and the protrusion has a section leaning toward the depression.

7. An IC card as claimed in claim 5, wherein:

said upper and lower panel members have side portions which extend longitudinally and are bent by approximately 180 degrees to form folded portions;

the fixing portions are provided on the folded portions; and a given gap is provided between the folded portions and the panel bodies.

8. An IC card as claimed in claim 5, wherein the fixing portions are formed with openings provided on bent portions which have been formed by bending the side portions extending longitudinally of the panel members approximately by 90 degrees.

9. An IC card as claimed in claim 5, wherein each fixing portion is comprised of:

a bent portion formed by bending the side portion extending longitudinally of the panel member by approximately 90 degrees; and a folded portion formed by folding back the edge of the bent portion toward the panel body, and wherein a given gap is provided between the folded portion and the bent portion.

10. An IC card as claimed in claim 5, wherein a plurality of the depressions and the fixing portions are provided along the longitudinal directions of the frame and the panel members, respectively.

11. A method of manufacturing an IC card comprising fixing upper and lower panel members covering plane portions of the card to the top and bottom surfaces of a resin frame to form the card exterior wherein projections projecting upward or downward and having a given height are provided at a given distance inwardly from outside edges of the frame;

cut-outs capable of fitting on the projections are provided on the panel members;

the panel members are assembled on the top and bottom surfaces of the frame with the cut-outs fitted on the corresponding projections; and a portion of each projection, in a melted or softened state, is deformed by pressing the panel members from above or below under a predetermined condition so that the panel members are secured to the top and bottom surfaces of the frame, respectively.

12. A manufacturing method according to claim 11, wherein the pressing process in which the panel members are pressed from above or below is executed at a predetermined temperature resulting from heating.

13. A manufacturing method of an IC card as claimed in claim 11, wherein the press process in which the panel members are pressed from above or below is executed concurrently with the application of ultrasonic vibrations.

14. A method of manufacturing an IC card comprising:

fixing upper and lower panel members covering plane portions of the card to the top and bottom surfaces of a resin frame to form the exterior of the card, wherein depressions recessed upward or downward and having a given depth are provided at a given distance inwardly from the outside edges of the frame;

fixing portions capable of fitting in the depressions are provided on each panel member;

the panel members are assembled on the top and bottom surfaces of the frame with the fixing portions fitted in the corresponding depressions;

and at least a portion of the circumference of each depression is then deformed by pressing the panel members from above or below under a predetermined condition so that the panel members are secured to the top and bottom surfaces of the frame, respectively.

15. A manufacturing method as claimed in claim 14, wherein the pressing process in which the panel members are pressed from above or below is executed at a predetermined temperature resulting from heating.

16. A manufacturing method as claimed in claim 14, wherein the pressing process in which the panel members are pressed from above or below is executed concurrently with the application of ultrasonic vibrations.

* * * * *